(12) United States Patent
Mackin et al.

(10) Patent No.: US 12,003,240 B1
(45) Date of Patent: Jun. 4, 2024

(54) ANALOG MEMORY-BASED COMPLEX MULTIPLY-ACCUMULATE (MACC) COMPUTE ENGINE

(71) Applicant: International Business Machines Corporation, Armonk, NY (US)

(72) Inventors: Charles Mackin, San Jose, CA (US); Pritish Narayanan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/978,161

(22) Filed: Oct. 31, 2022

(51) Int. Cl.
*H03K 3/017* (2006.01)
*H03K 17/687* (2006.01)

(52) U.S. Cl.
CPC ......... *H03K 3/017* (2013.01); *H03K 17/6871* (2013.01)

(58) Field of Classification Search
CPC ........................... H03K 3/017; H03K 17/6871
See application file for complete search history.

(56) References Cited

U.S. PATENT DOCUMENTS

| | | | |
|---|---|---|---|
| 10,878,317 B2 | 12/2020 | Hatcher | |
| 2009/0128210 A1* | 5/2009 | Yamamoto | H03K 3/356043 327/202 |
| 2011/0038183 A1 | 2/2011 | Yang | |
| 2020/0167530 A1 | 5/2020 | Buchanan | |

FOREIGN PATENT DOCUMENTS

| | | |
|---|---|---|
| CN | 102170221 | 8/2011 |
| CN | 104321959 | 1/2015 |
| CN | 105917578 | 8/2016 |

OTHER PUBLICATIONS

Fyrigos, I-A et al., "Memristor Crossbar Arrays Performing Quantum Algorithms," IEEE Transactions on Circuits and Systems I: Regular Papers, vol. 69, No. 2, pp. 552-563, Feb. 2022.

Hamerly, Ryan et al., "Large-Scale Optical Neural Networks Based on Photoelectric Multiplication," Physical Review X 9, No. 2, 2019, 12 pages.

(Continued)

*Primary Examiner* — Metasebia T Retebo
(74) *Attorney, Agent, or Firm* — Daniel Morris; Otterstedt & Kammer PLLC

(57) ABSTRACT

A circuit comprises a first pulse-width modulator configured to generate a first pulse based on a first input, a second pulse-width modulator configured to generate a second pulse based on a second input, a first differential circuit comprising a first transistor, a second transistor, a first resistor, and a second resistor, and a second differential circuit comprising a first transistor, a second transistor, a first resistor, and a second resistor. A gate of the first transistor of the first differential circuit and a gate of the second transistor of the first differential circuit, and a gate of the first transistor of the second differential circuit and a gate of the second transistor of the second differential circuit are configured to be controlled by the first and second pulse width modulators based on the first input and the second input.

17 Claims, 11 Drawing Sheets

(56) References Cited

OTHER PUBLICATIONS

James, Alex P. et al., "Analog Neural Computing with Super-resolution Memristor Crossbars," IEEE Transactions on Circuits and Systems I: Regular Papers 68, No. 11, 2021, 13 pages.

Autograd Basics · pytorch/pytorch Wiki · GitHub. Downloaded from https://github.com/pytorch/pytorch/wiki/Autograd-Basics Sep. 6, 2022, pp. 5.

PyTorch. Downloaded from https://pytorch.org/ Oct. 26, 2022. pp. 5.

Zhang H, Gu M, Jiang XD, Thompson J, Cai H, Paesani S, Santagati R, Laing A, Zhang Y, Yung MH, Shi YZ. An optical neural chip for implementing complex-valued neural network. Nature communications. Jan. 19, 2021;12(1):457. (pp. 1-11.).

Authorized officer Huo, YuMing. China National Intellectual Property Administration related PCT/CN2023/117187. ISR and WO. mailed Oct. 23, 2023. pp. 7.

\* cited by examiner

US 12,003,240 B1

ANALOG MEMORY-BASED COMPLEX MULTIPLY-ACCUMULATE (MACC) COMPUTE ENGINE

BACKGROUND

The present invention relates generally to the electrical, electronic and computer arts and, more particularly, to compute engines.

Multiply-accumulate (MACC) operations in machine learning typically only use real valued numbers. Complex-valued neural networks, however, are gaining more research interest. For example, one conventional application provides automatic differentiation to implement the backpropagation algorithm and now supports a number of complex layers and activation functions.

Moreover, crossbar arrays are conventionally used to implement neural networks and numerical computing units as they provide efficient in-memory computing. Supervised and unsupervised learning may be implemented using the artificial behavior of synapses and neurons provided by the neural networks implemented with crossbar arrays. Crossbar arrays also support the performance of MACC operations based on the physics of Ohm's law and Kirchhoff s law. While crossbar arrays can accelerate the performance of MACC operations, they typically only focus on real valued numbers.

BRIEF SUMMARY

Principles of the invention provide an analog memory-based complex multiply-accumulate (MACC) compute engine. In one aspect, an exemplary circuit comprises a first pulse-width modulator configured to generate a first pulse based on a first input, a second pulse-width modulator configured to generate a second pulse based on a second input, a first differential circuit comprising a first transistor, a second transistor, a first resistor, and a second resistor, a second differential circuit comprising a first transistor, a second transistor, a first resistor, and a second resistor, wherein a gate of the first transistor of the first differential circuit and a gate of the second transistor of the first differential circuit, and a gate of the first transistor of the second differential circuit and a gate of the second transistor of the second differential circuit are configured to be controlled by the first and second pulse width modulators based on the first input and the second input, wherein: the first resistor of the first differential circuit has a configurable resistance, a first terminal of the first resistor is coupled to a voltage via a voltage supply node and a second terminal of the first resistor is coupled to a first terminal of the first transistor of the first differential circuit; the second resistor of the first differential circuit has a configurable resistance, a first terminal of the second resistor of the first differential circuit is coupled to the voltage via the voltage supply node and a second terminal of the second resistor of the first differential circuit is coupled to a first terminal of the second transistor of the first differential circuit; the first resistor of the second differential circuit has a configurable resistance, a first terminal of the first resistor of the second differential circuit is coupled to the voltage via the voltage supply node and a second terminal of the first resistor of the second differential circuit is coupled to a first terminal of the first transistor of the second differential circuit; and the second resistor of the second differential circuit has a configurable resistance, a first terminal of the second resistor of the second differential circuit is coupled to the voltage via the voltage supply node and a second terminal of the second resistor of the second differential circuit is coupled to a first terminal of the second transistor of the second differential circuit; and the circuit further comprises an analog-to-digital converter having an input coupled to the voltage supply node.

In one aspect, a circuit comprises a differential circuit comprising a first transistor, a second transistor, a first resistor, and a second resistor, a first pulse-width modulator configured to generate a pulse based on a first input, an output of the first pulse-width modulator configured to be selectively coupled to one of a gate of the first transistor of the differential circuit and a gate of the second transistor of the differential circuit, the first resistor of the differential circuit having a configurable resistance, a first terminal of the first resistor coupled to a voltage via a voltage supply node and a second terminal of the first resistor coupled to a first terminal of the first transistor, a second pulse-width modulator configured to generate a pulse based on a second input, an output of the second pulse-width modulator configured to be selectively coupled to one of the gate of the first transistor of the differential circuit and the gate of the second transistor of the differential circuit; the second resistor of the differential circuit having a configurable resistance, a second terminal of the second resistor coupled to the voltage via the voltage supply node and coupled to the second terminal of the first resistor, and a second terminal of the second resistor coupled to a first terminal of the second transistor; and an analog-to-digital converter having an input coupled to the voltage supply node.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

implementation of complex-valued MACC operations in crossbar arrays;

complex MACC compute engines capable of performing complex-valued MACC operations in addition to conventional real valued MACC operations;

added flexibility, more degrees of freedom for deep learning, and broader generalization of MACC compute engines;

extension of the energy efficiency and per-area throughput benefits of conventional crossbar arrays into the complex domain;

very low overhead pulse width modulation (PWM) re-routing;

ability to handle complex valued synaptic weights and complex valued activations;

implementation requiring only slight unit cell modifications and additional PWM routing; and utility for training deep neural networks (DNNs).

Some embodiments may not have these potential advantages and these potential advantages are not necessarily required of all embodiments. These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

In one or more embodiments, crossbar arrays are advantageously adapted to perform MACC operations on complex valued numbers. The resulting complex MACC compute engines can also be used to perform conventional real valued MACC operations. Thus, disclosed embodiments represent a more generalized MACC compute engine that is capable of handling both real and complex valued MACC operations and provides more degrees of freedom for deep learning, added flexibility, and broader generalization. In one example embodiment, crossbar arrays are adapted to store complex valued synaptic weights and activations in rectangular coordinates. Aspects of the disclosed techniques extend the energy efficiency and per-area throughput benefits of conventional crossbar arrays into the complex domain. In one example embodiment, MACC operations can be handled by introducing additional re-routing circuitry.

Performing complex-valued MACC operations, such as summing the results of multiplication operations $z_n^x z_n^w$, typically require four different MACC terms (where, for example, $z_n^x$ is represented by real and imaginary components $a_n$ and $jb_n$, respectively, and $z_n^w$ is represented by real and imaginary components $c_n$ and $jd_n$, respectively) to be combined into real and imaginary portions of the output MACC:

$$z_1^x z_1^w + z_2^x z_2^w + \ldots$$

where:

$$M: z_1^x z_1^w = (a_1 + jb_1)(c_1 + jd_1) = (a_1 c_1 - b_1 d_1) + j(a_1 d_1 + b_1 c_1)$$

$$M: z_2^x z_2^w = (a_2 + jb_2)(c_2 + jd_2) = (a_2 c_2 - b_2 d_2) + j(a_2 d_2 + b_2 c_2)$$

$$M: z_n^x z_n^w = (a_n + jb_n)(c_n + jd_n) = \underbrace{(a_n c_n - b_n d_n)}_{Re} + \underbrace{j(a_n d_n + b_n c_n)}_{Im}$$

$$\underbrace{\phantom{(a_n + jb_n)}}_{x} \underbrace{\phantom{(c_n + jd_n)}}_{w}$$

where each are composed of real $R_e$ and imaginary $I_m$ terms. In the above equations, x represents the activations and w represents the weights.

In one example embodiment, complex-valued MACC operations are implemented in crossbar arrays. Circuitry to enable the computation of the real and imaginary terms simultaneously is disclosed such that only two computational phases are required.

Figure 1A:
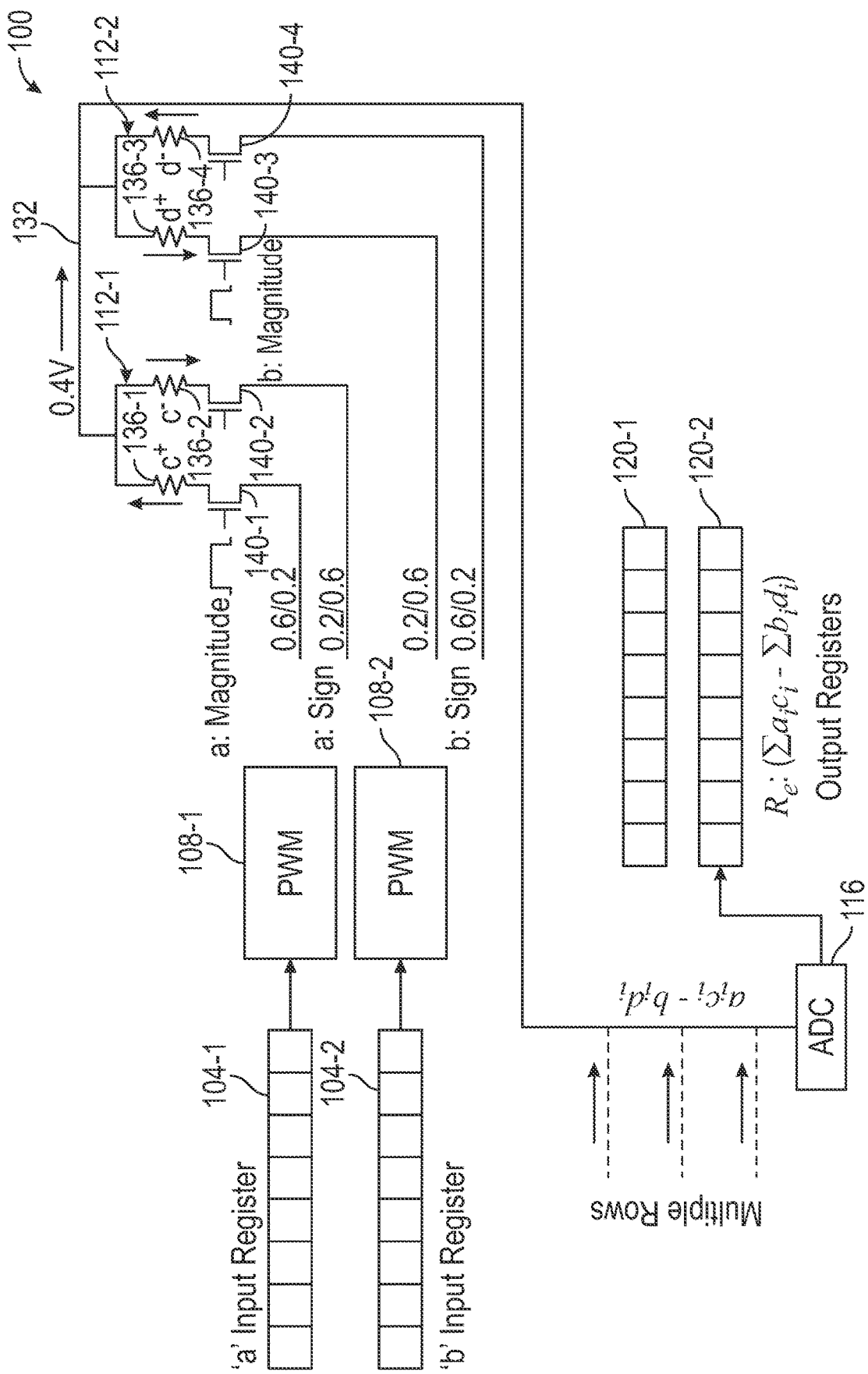
FIG. 1A is a circuit diagram for a first example embodiment of a circuit for a MACC compute engine, in accordance with an example embodiment.

FIG. 1A is a circuit diagram for a first example embodiment of a circuit 100 for a MACC compute engine, in accordance with an example embodiment. FIG. 1A illustrates the configuration for phase 1, the computation of the real term (where the complex MACC consists of 4 terms). The terms a, b, c, and d can be positive or negative, where $c=c^+-c^-$ and $d=d^+-d^-$ represent the weights w and are implemented by the resistor pairs 136-1, 136-2, 136-3, 136-4 in conjunction with the transistors 140-1, 140-2, 140-3, 140-4, such as field-effect transistors (FETs). As described more fully below, the gate of each transistor 140-1, 140-2 is driven by the a: magnitude signal and the gate of each transistor 140-3, 140-4 is driven by the b: magnitude signal. In one example implementation, the drain of each transistor 140-1, 140-2, 140-3, 140-4 is driven by a selected voltage determined by the sign of the corresponding term of the activation and the source of each transistor 140-1, 140-2, 140-3, 140-4 is coupled to resistor 136-1, 136-2, 136-3, 136-4, respectively. It is noted that representative read voltages of 0.2V, 0.4V, 0.6V are used as an example (other representative read voltages are contemplated).

During phase 1, an 'a' input register 104-1 stores the a-term of the activations and a 'b' input register 104-2 stores the b-term of the activations. Pulse-width modulators 108-1, 108-2 generate an a-magnitude pulse and a b-magnitude pulse, respectively, which are applied to the gates of circuit pairs 112-1, 112-2, respectively. As the widths of the pulses are proportional to the a-term of the activations and the b-term of the activations, respectively, the currents through the resistor pairs 136-1, 136-2, 136-3, 136-4 ($c^+$, $c^-$ and $d^+$, $d^-$) will flow for an amount of time proportional to the pulse widths (and therefore proportional to the a-term and the b-term of the activations, respectively). It is noted that the voltage supply node 132 (also referred to as node 132 herein) is maintained as 0.4 volts (V), as indicated, and that the current, indicated by the arrows, will flow in one direction for positive values of the terms of the activations, and in the opposite direction for negative values of the terms of the activations. The amount of current flowing towards the analog-to-digital converter (ADC) 116 will be representative of the computed real term and is converted to a binary value by the current-based ADC 116 and stored in output register 120-2. By coupling the nodes 132 of other circuits 100 (that represent other activations and weights from other multiply operations), the sum of the MACC operation may be input to the ADC 116 and stored in the output register 120-2. Note that output register 120-1 is described below in connection with FIG. 1B. It is noted that in one or more embodiments, the absolute value of each resistor pair 136-1, 136-2, 136-3, 136-4 is not as important as the shape of the distribution of the resistance values. In one or more embodiments, a unitless weight distribution trained in software is rescaled into appropriate hardware units (conductance in microsiemens or µS) by some constant scale factor. In that way, the shape of the weight distribution is not distorted. The skilled artisan will be familiar with the use of pulse units and a suitable controller for setting weights (conductances) of memristive elements to a desired set, reset, and/or intermediate state. In one or more embodiments, activations are encoded as pulse widths only, with no difference in amplitude. Furthermore, in one or more embodiments, only the relative resistance values are important; it is only required to preserve the distribution of weights/resistances. Furthermore, in one or more embodiments, a weight distribution is obtained from software (unitless) and it is to be programmed in hardware (microSiemens). Accordingly, apply some constant rescaling factor such that the units change but the shape of the distribution does not.

Figure 1B:
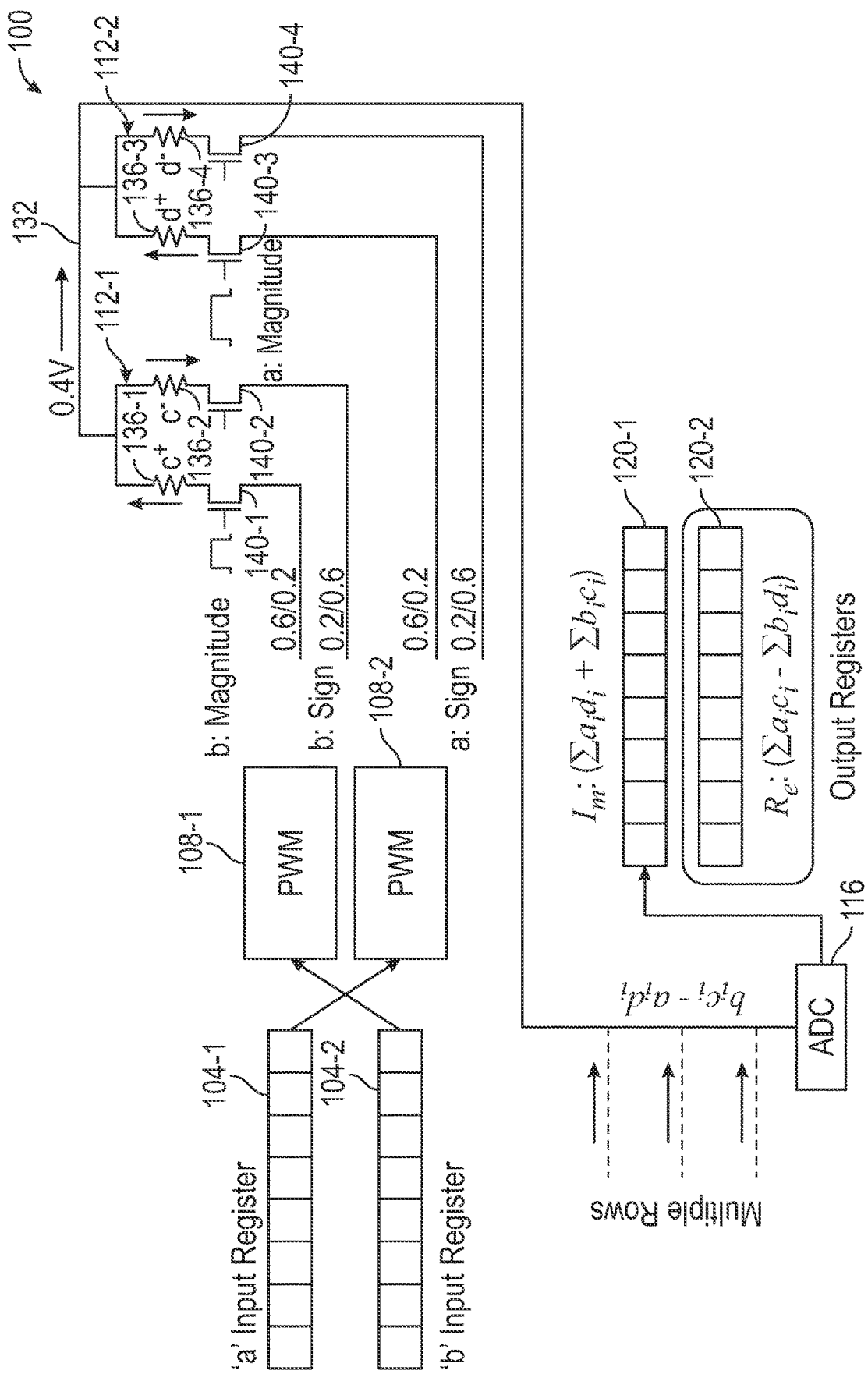
FIG. 1B is a circuit diagram for the first example embodiment of the circuit for the MACC compute engine of FIG. 1A as configured for phase 2, the computation of the imaginary terms, in accordance with an example embodiment.

FIG. 1B is a circuit diagram for the first example embodiment of the circuit 100 for the MACC compute engine of FIG. 1A as configured for phase 2, the computation of the imaginary terms, in accordance with an example embodiment. As illustrated in FIG. 1B, the application of the outputs of the 'a' input register 104-1 and the 'b' input register 104-2 to the pulse-width modulators 108-1, 108-2, the application of the a-magnitude pulse and the b-magnitude pulse to the gates of the circuit pairs 112-1, 112-2, and the application of the 'a' sign and the 'b' sign to the circuit pairs 112-1, 112-2 are reversed. As will be appreciated by the skilled artisan, in the example of FIG. 1B, a: sign and b: sign are analog voltages that are applied to the bottom terminal of the gating transistors, and that may be governed by corresponding digital sign bits (not shown). (It is noted that the first pair of voltages correspond to a positive sign and the second pair of voltages correspond to a negative sign.) For the avoidance of doubt, in one or more embodiments, there is a sign bit; however, for illustrative brevity, the diagrams show analog voltages. In one or more embodiments, there exists some circuitry, omitted for illustrative brevity, which translates this sign bit into the corresponding analog voltages shown as 0.2V and 0.6V throughout the diagrams. The skilled artisan can implement such circuitry using known techniques, given the teachings herein.

As in phase 1, 1) the widths of the pulses are proportional to the a-term of the activations and the b-term of the activations, respectively; 2) the currents through the resistor pairs 136-1, 136-2, 136-3, 136-4 ($c^+$, $c^-$ and $d^+$, $d^-$) will flow for an amount of time proportional to the pulse widths (and therefore proportional to the a-term and the b-term of the activations, respectively); and the current, indicated by the arrows, will flow in one direction for positive values of the terms of the activations, and in the opposite direction for negative values of the terms of the activations. The amount of current flowing towards the ADC 116 will be representative of the computed imaginary term and is converted to a binary value by the ADC 116 and stored in output register 120-1. (As indicated by the shaded area, the output register 120-2 maintains the computed real term during phase 2.) After phase 2, the real and imaginary terms can be transported to the input of another array, passed through an activation function, and the like. It is noted that, instead of swapping the application of the outputs of the 'a' input register 104-1 and the 'b' input register 104-2 to the pulse-width modulators 108-1, 108-2, the application of the outputs of the pulse-width modulators 108-1, 108-2 to the gates may be swapped (applicable to all embodiments). The skilled artisan will appreciate that the first voltage pair values of the sign bits correspond to a positive activation term.

Figure 1C:
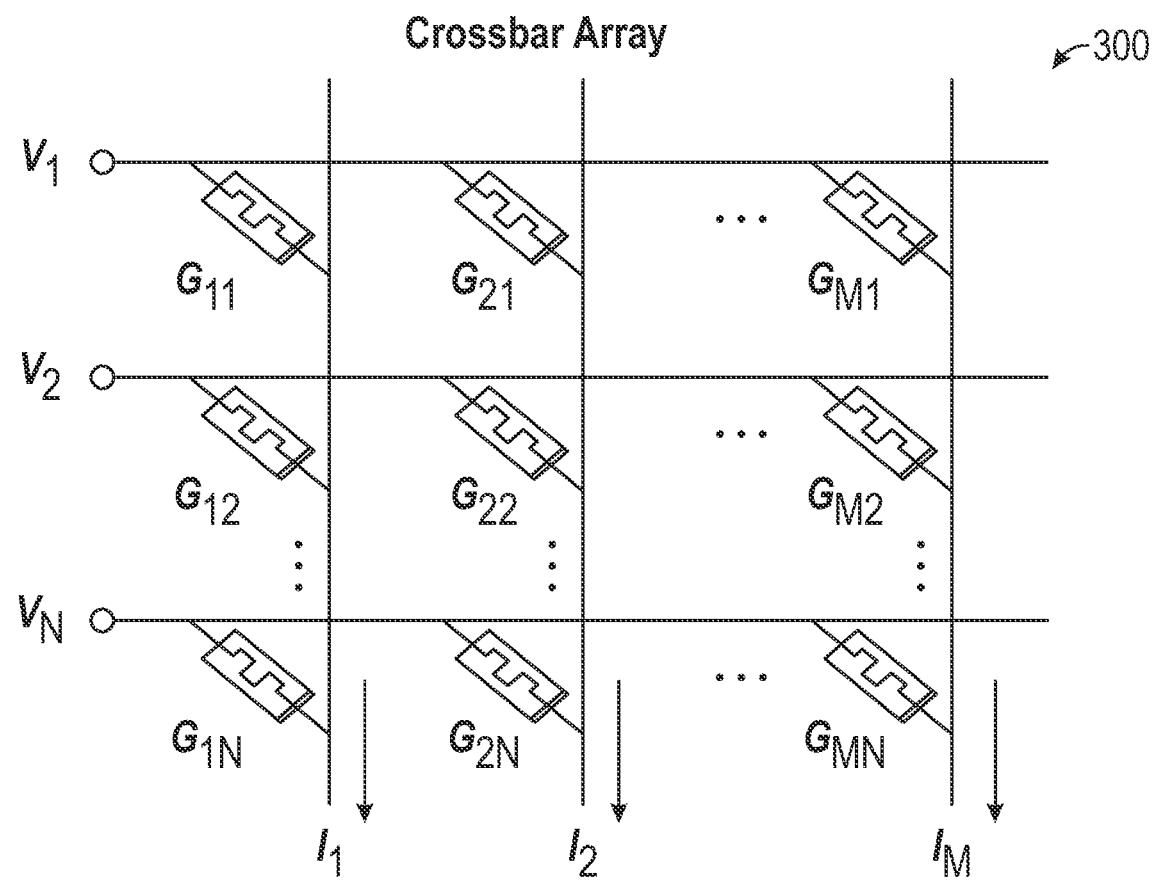
FIG. 1C illustrates an example representation of a conventional crossbar array.

FIG. 1C illustrates an example representation of a conventional crossbar array. Input values $V_1$ through $V_N$ generate output currents $I_1$ through $I_M$. It is noted that the circuit 100 of FIGS. 1A and 1B provides support for complex conductance (G) values for the crossbar array 300. Thus, in one or more embodiments, the G values are complex and the inputs (activations) are encoded using voltages and pulse durations, and could be designated, for example, as Complex Input Value$_1$, Complex Input Value$_2$, Complex Input Value$_N$ rather than $V_1$, $V_2$, ..., $V_N$ as in the prior art. FIG. 1C thus represents a standard MACC block or tile, which relates to FIGS. 1A and 1B in that each input and conductance element is now complex valued in rectangular coordinates, meaning that in the input activations and weights now contain two values each (real and imaginary). In this way, the high-level FIG. 1C is related to the more specific circuit implementations shown in 1A, B.

Figure 2A:
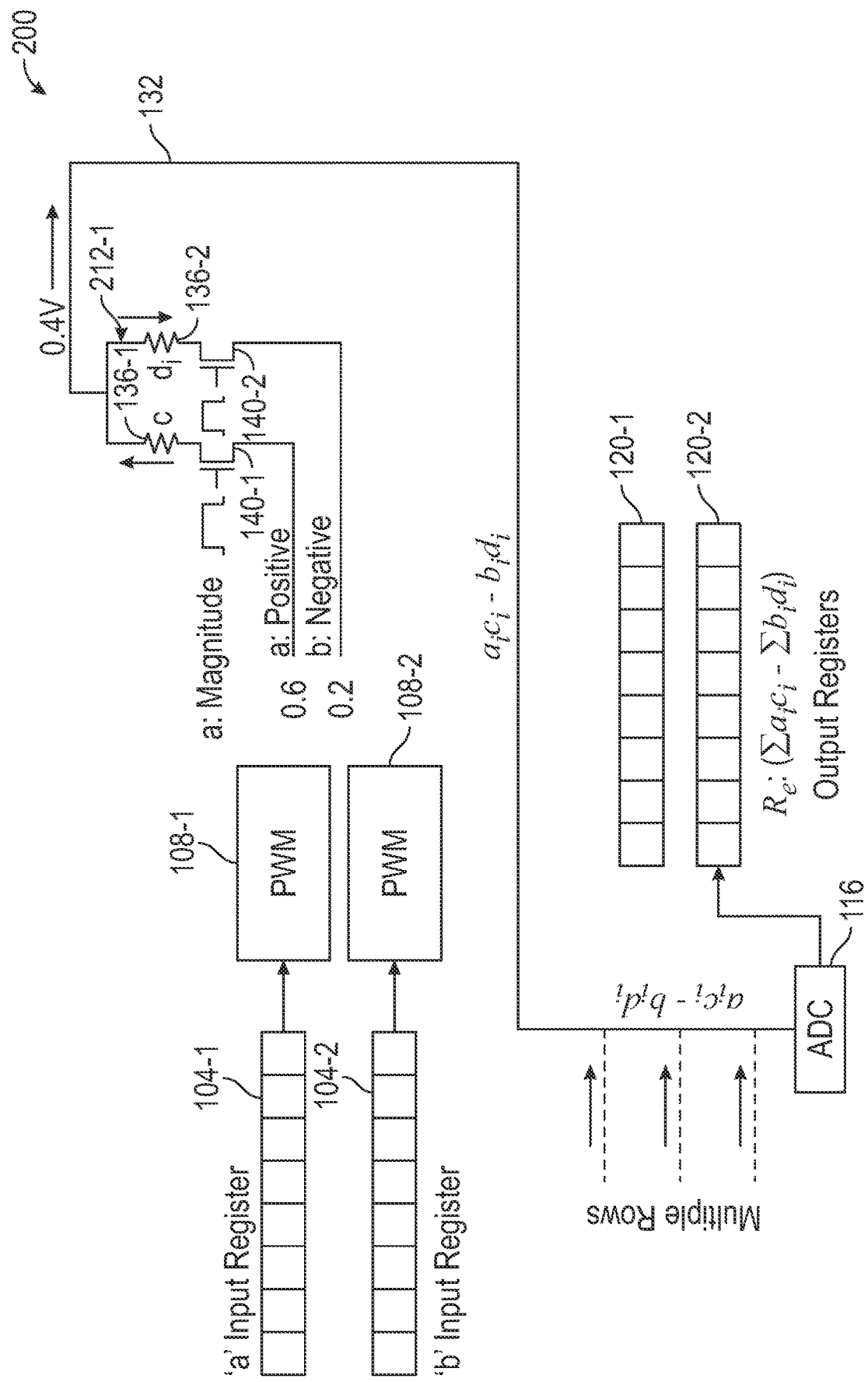
FIG. 2A is a circuit diagram for a second example embodiment of a circuit for the MACC compute engine, in accordance with an example embodiment.

FIG. 2A is a circuit diagram for a second example embodiment of a circuit 200 for the MACC compute engine, in accordance with an example embodiment. FIG. 2A illustrates the configuration for phase 1, the computation of the real term where the complex MAC consists of 4 terms. The terms a, b, c, d are limited to being positive; thus, there are no sign bits or corresponding circuitry. Since all terms are positive, each weight may be represented by a single resistor 136-1, 136-2 and the currents always flow through the resistors 136-1, 136-2 in the same direction. It is noted that representative read voltages of 0.2V, 0.4V, 0.6V are used as an example (other representative read voltages are contemplated). Note that the 'b' sign is negative to implement the subtraction operation in the summation for the bid, term.

During phase 1, an 'a' input register 104-1 stores the a-term of the activations and a 'b' input register 104-2 stores the b-term of the activations. If two imaginary numbers are multiplied, a −1 is obtained. Thus, if an imaginary number is denoted by j, then j*j=−1 (by definition). Refer to the equations above for complex-valued MACC operations. Pulse-width modulators 108-1, 108-2 generate an a-magnitude pulse and a b-magnitude pulse, respectively, which are applied to the gates of circuit pair 212-1, respectively. As the widths of the pulses are proportional to the a-term of the activations and the b-term of the activations, respectively, the currents through the resistor pairs 136-1, 136-2 (c and d) will flow for an amount of time proportional to the pulse widths (and therefore proportional to the a-term and the b-term of the activations, respectively). It is noted that the node 132 is maintained as 0.4 volts (V), as indicated, and that the current, indicated by the arrows, will flow in one direction for positive values of the terms of the activations, and in the opposite direction for negative values of the terms of the activations. The amount of current flowing towards the analog-to-digital converter (ADC) 116 will be representative of the computed real term and is converted to a binary value by the current-based ADC 116 and stored in output register 120-2. By coupling the nodes 132 of other circuits 100 (that represent other activations and weights from other multiply operations), the sum of the MACC operation may be input to the ADC 116 and stored in the output register 120-2. Note that output register 120-1 is described below in connection with FIG. 2B.

Figure 2B:
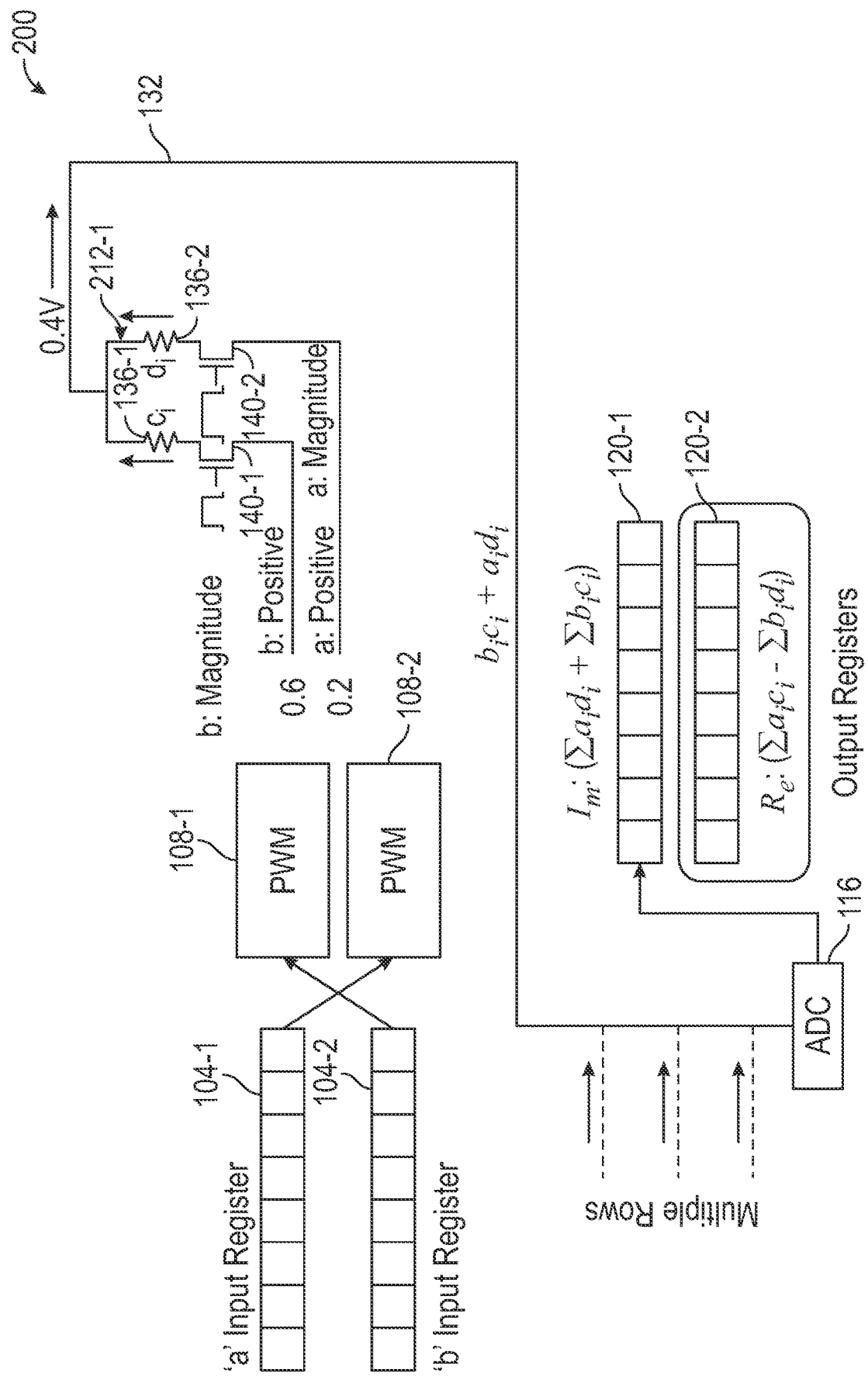
FIG. 2B is a circuit diagram for the second example embodiment of the circuit for the MACC compute engine of FIG. 2A as configured for phase 2, the computation of the imaginary terms, in accordance with an example embodiment.

FIG. 2B is a circuit diagram for the second example embodiment of the circuit 200 for the MACC compute engine of FIG. 2A as configured for phase 2, the computation of the imaginary terms, in accordance with an example embodiment. As illustrated in FIG. 2B, the application of the outputs of the 'a' input register 104-1 and the 'b' input register 104-2 to the pulse-width modulators 108-1, 108-2 and the application of the a-magnitude pulse and the b-magnitude pulse to the gates of the circuit pair 212-1 are reversed. As in phase 1, 1) the widths of the pulses are proportional to the a-term of the activations and the b-term of the activations, respectively; and 2) the currents through the resistor pairs 136-1, 136-2 (c and d) will flow for an amount of time proportional to the pulse widths (and therefore proportional to the a-term and the b-term of the activations, respectively). The amount of current flowing towards the ADC 116 will be representative of the computed imaginary term and is converted to a binary value by the ADC 116 and stored in output register 120-1. (As indicated by the shaded area, the output register 120-2 maintains the computed real term during phase 2.) After phase 2, the real and imaginary terms can be transported to the input of another array, passed through an activation function, and the like.

Figure 3A:
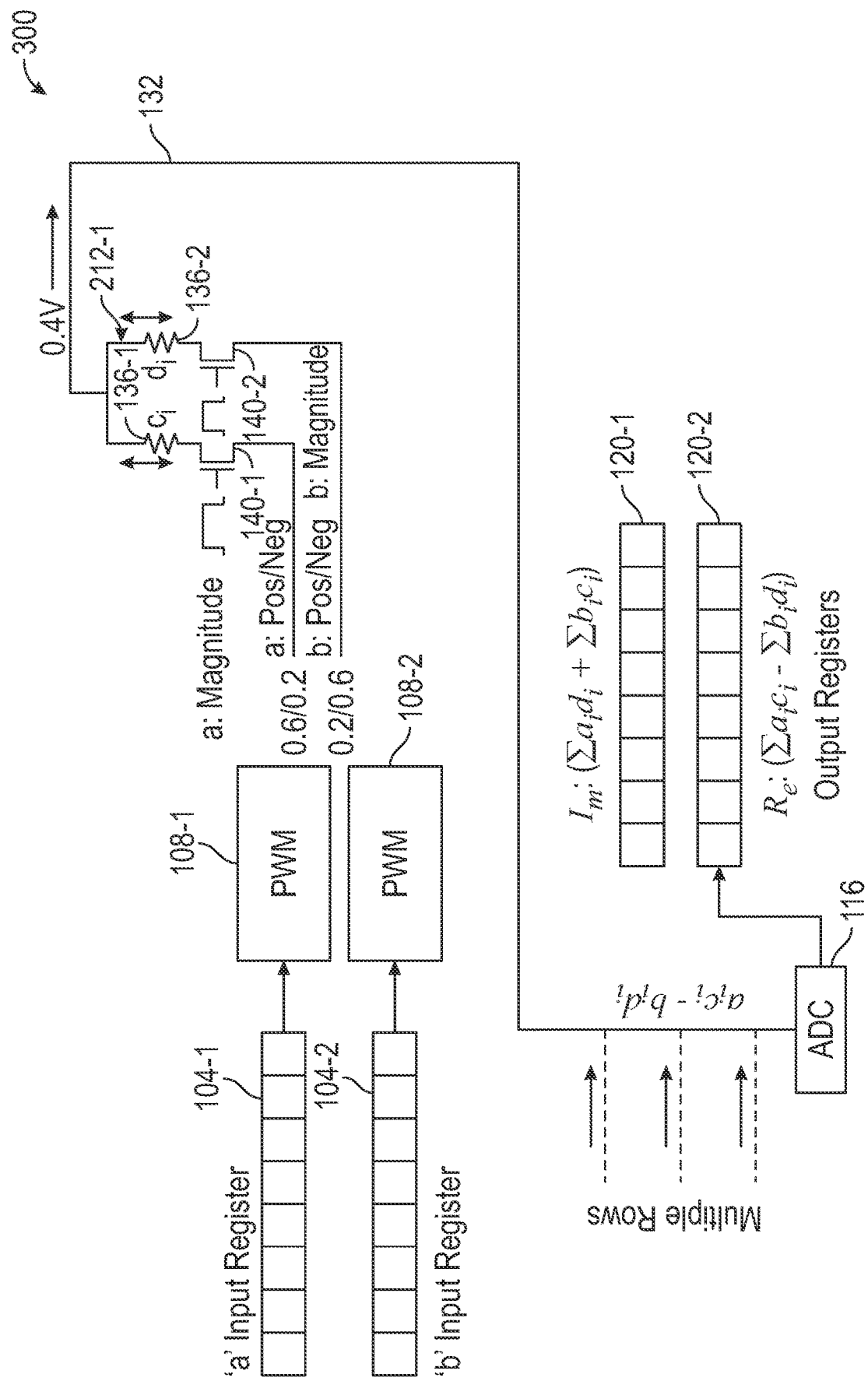
FIG. 3A is a circuit diagram for a third example embodiment of a circuit for the MACC compute engine, in accordance with an example embodiment.

FIG. 3A is a circuit diagram for a third example embodiment of a circuit 300 for the MACC compute engine, in accordance with an example embodiment. FIG. 3A illustrates the configuration for phase 1, the computation of the real term where the complex MAC consists of 4 terms. The terms a, b can be either positive or negative, whereas c and d are positive. Since the weights are always positive, each weight may be represented by a single resistor 136-1, 136-2; however, since the activations may be positive or negative, the direction of the flow of the currents through the resistors 136-1, 136-2 is controlled by the sign bits. It is noted that representative read voltages of 0.2V, 0.4V, 0.6V are used as an example (other representative read voltages are contemplated).

During phase 1, an 'a' input register 104-1 stores the a-term of the activations and a 'b' input register 104-2 stores the b-term of the activations. Pulse-width modulators 108-1, 108-2 generate an a-magnitude pulse and a b-magnitude pulse, respectively, which are applied to the gates of circuit pair 212-1, respectively. As the widths of the pulses are proportional to the a-term of the activations and the b-term of the activations, respectively, the currents through the resistor pairs 136-1, 136-2 (c and d) will flow for an amount of time proportional to the pulse widths (and therefore proportional to the a-term and the b-term of the activations, respectively). It is noted that the node 132 is maintained as 0.4 volts (V), as indicated, and that the current, indicated by the arrows, will flow in one direction for positive values of the terms of the activations, and in the opposite direction for negative values of the terms of the activations. The amount of current flowing towards the analog-to-digital converter (ADC) 116 will be representative of the computed real term and is converted to a binary value by the current-based ADC 116 and stored in output register 120-2. By coupling the nodes 132 of other circuits 100 (that represent other activations and weights from other multiply operations), the sum of the MACC operation may be input to the ADC 116 and stored in the output register 120-2. Note that output register 120-1 is described below in connection with FIG. 3B.

Figure 3B:
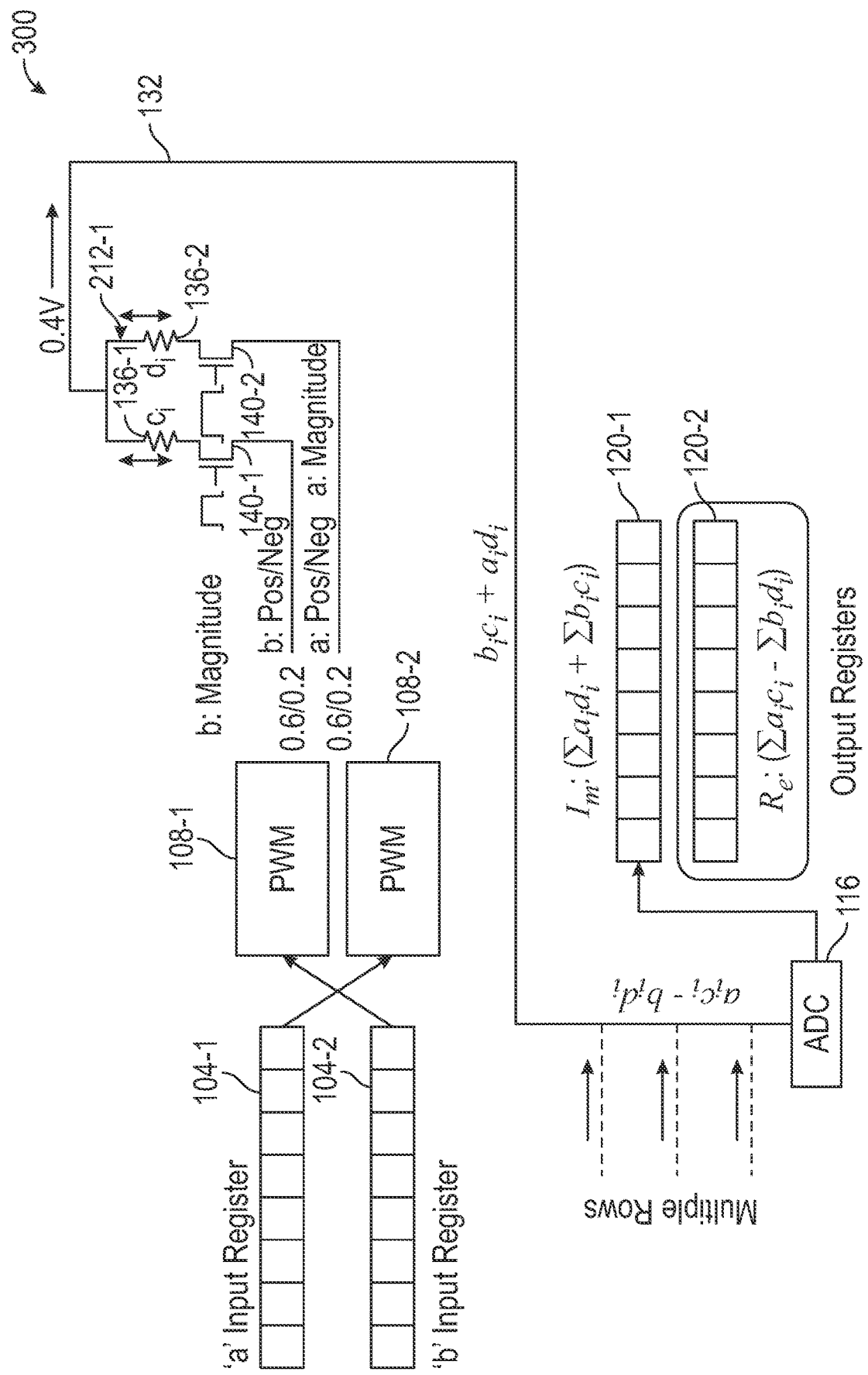
FIG. 3B is the circuit diagram for the third example embodiment of the circuit for the MACC compute engine of FIG. 3A as configured for phase 2, the computation of the imaginary terms, in accordance with an example embodiment.

FIG. 3B is the circuit diagram for the third example embodiment of the circuit 300 for the MACC compute engine of FIG. 3A as configured for phase 2, the computation of the imaginary terms, in accordance with an example embodiment. As with the embodiment of FIG. 1B, the application of the outputs of the 'a' input register 104-1 and the 'b' input register 104-2 to the pulse-width modulators 108-1, 108-2, the application of the a-magnitude pulse and the b-magnitude pulse to the gates of the circuit pair 212-1 and the application of the 'a' sign bit and the 'b' sign bit to the circuit pair 212-1 are reversed. As in phase 1, 1) the widths of the pulses are proportional to the a-term of the activations and the b-term of the activations, respectively; 2) the currents through the resistor pairs 136-1, 136-2 (c and d) will flow for an amount of time proportional to the pulse widths (and therefore proportional to the a-term and the b-term of the activations, respectively); and the current flow, indicated by the arrows, will flow in one direction for positive values of the terms of the activations, and in the opposite direction for negative values of the terms of the activations. The amount of current flowing towards the ADC 116 will be representative of the computed imaginary term and is converted to a binary value by the ADC 116 and stored in output register 120-1. (As indicated by the shaded area, the output register 120-2 maintains the computed real term during phase 2.) After phase 2, the real and imaginary terms can be transported to the input of another array, passed through an activation function, and the like.

Figure 4A:
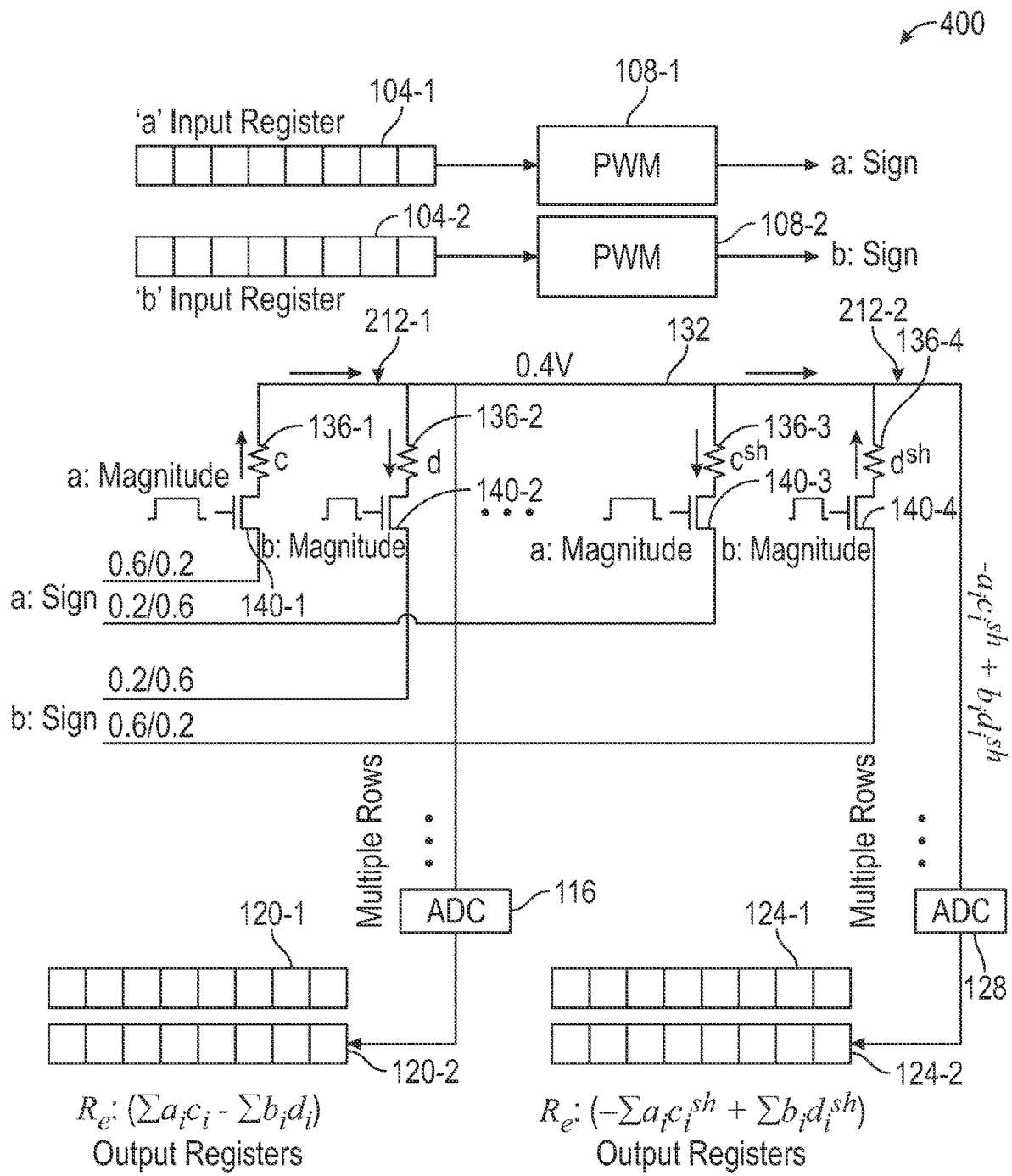
FIG. 4A is a circuit diagram for a fourth example embodiment of a circuit for the MACC compute engine, in accordance with an example embodiment.

FIG. 4A is a circuit diagram for a fourth example embodiment of a circuit 400 for the MACC compute engine, in accordance with an example embodiment. FIG. 4A illustrates the configuration for phase 1, the computation of the real term where the complex MAC consists of 4 terms. The terms a, b, c, d can be positive or negative, where $c'=c-c^{sh}$ and $d'=d-d^{sh}$. In the embodiment of FIG. 4A, the resistors 136-3, 136-4 in circuit pair 212-2 are shared by all circuit pairs 212-1 assigned to the same MACC operation and generate their own real and imaginary components via a current-based ADC 128 for storage in output registers 124-2, 124-1, respectively. Similarly, the resistors 136-1, 136-2 in circuit pair 212-1 together generate their own real and imaginary components for the MACC operation via the current-based ADC 116 for storage in output registers 120-2, 120-1, respectively, during phases 1 and 2. It is noted that representative read voltages of 0.2V, 0.4V, 0.6V are used as an example (other representative read voltages are contemplated).

Figure 4B:
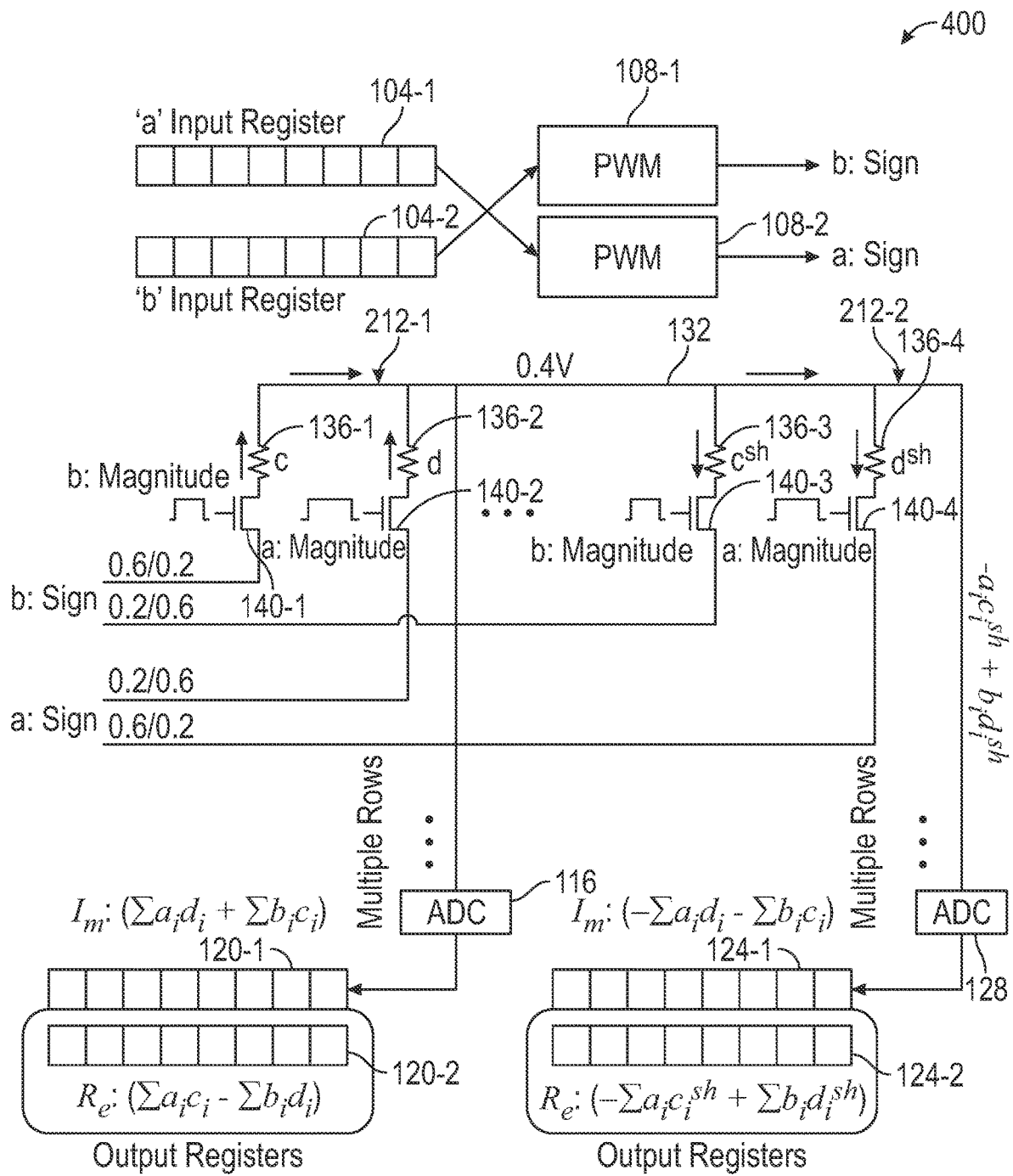
FIG. 4B is the circuit diagram for the fourth example embodiment of the circuit for the MACC compute engine of FIG. 3B as configured for phase 2, the computation of the imaginary terms, in accordance with an example embodiment.

FIG. 4B is the circuit diagram for the fourth example embodiment of the circuit 400 for the MACC compute engine of FIG. 3B as configured for phase 2, the computation of the imaginary terms, in accordance with an example embodiment. Following, phase 2, the values stored in the real output registers 120-2, 124-2 are summed to produce the final real component and the values stored in the real output registers 120-1, 124-1 are summed to produce the final imaginary component. At this point, the real and imaginary terms can be transported to the input of another array, passed through an activation function, and the like. In one or more embodiments, a summation is used for determining the final result.

Figure 5:
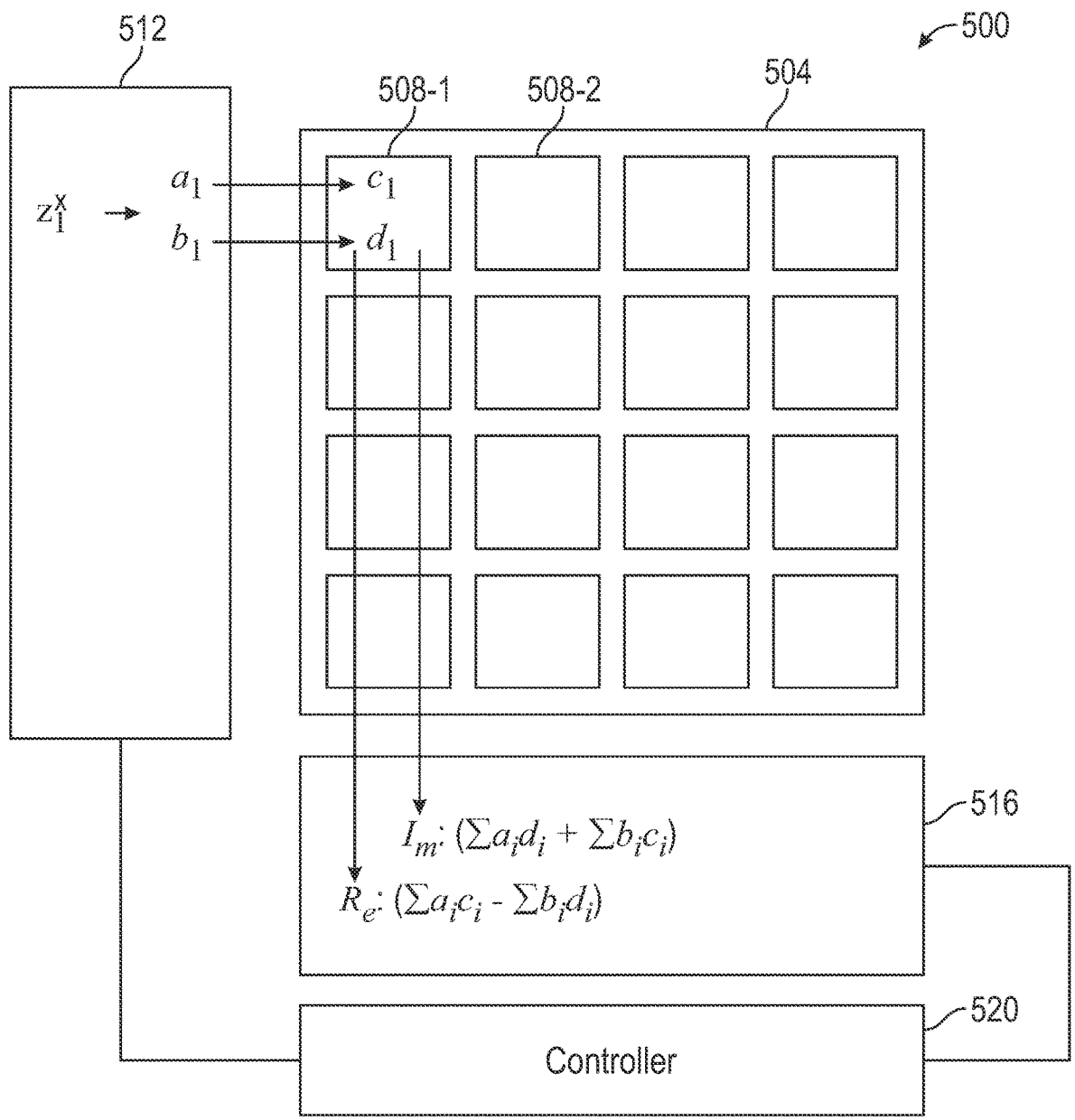
FIG. 5 is a high-level diagram of an implementation of a MACC compute engine, in accordance with an example embodiment.

FIG. 5 is a high-level diagram 500 of an implementation of a MACC compute engine, in accordance with an example embodiment. In one example embodiment, engine 500 includes an array 504 of circuits 508-1, 508-2, such as circuits 100, 200, 300, 400. As described above, each circuit 508-1, 508-2 inputs activations $a_1$, $b_1$ and is programmed with weights $c_1$, $d_1$. As will be appreciated by the skilled artisan, in machine learning, the weights represent the learned values which govern the behavior of the neural network. To perform the computation, the imaginary component is computed by flipping the signs and re-routing the pulses. In example embodiments, as described above, each complex x term is represented using two pulse trains and each complex w term is represented using two non-volatile memory (NVM) devices. It is noted that proof of concept experiments were conducted, and satisfactory results were obtained (proof-of-concept work, which required training complex valued neural nets, was performed using a known machine learning framework).

Figure 6:
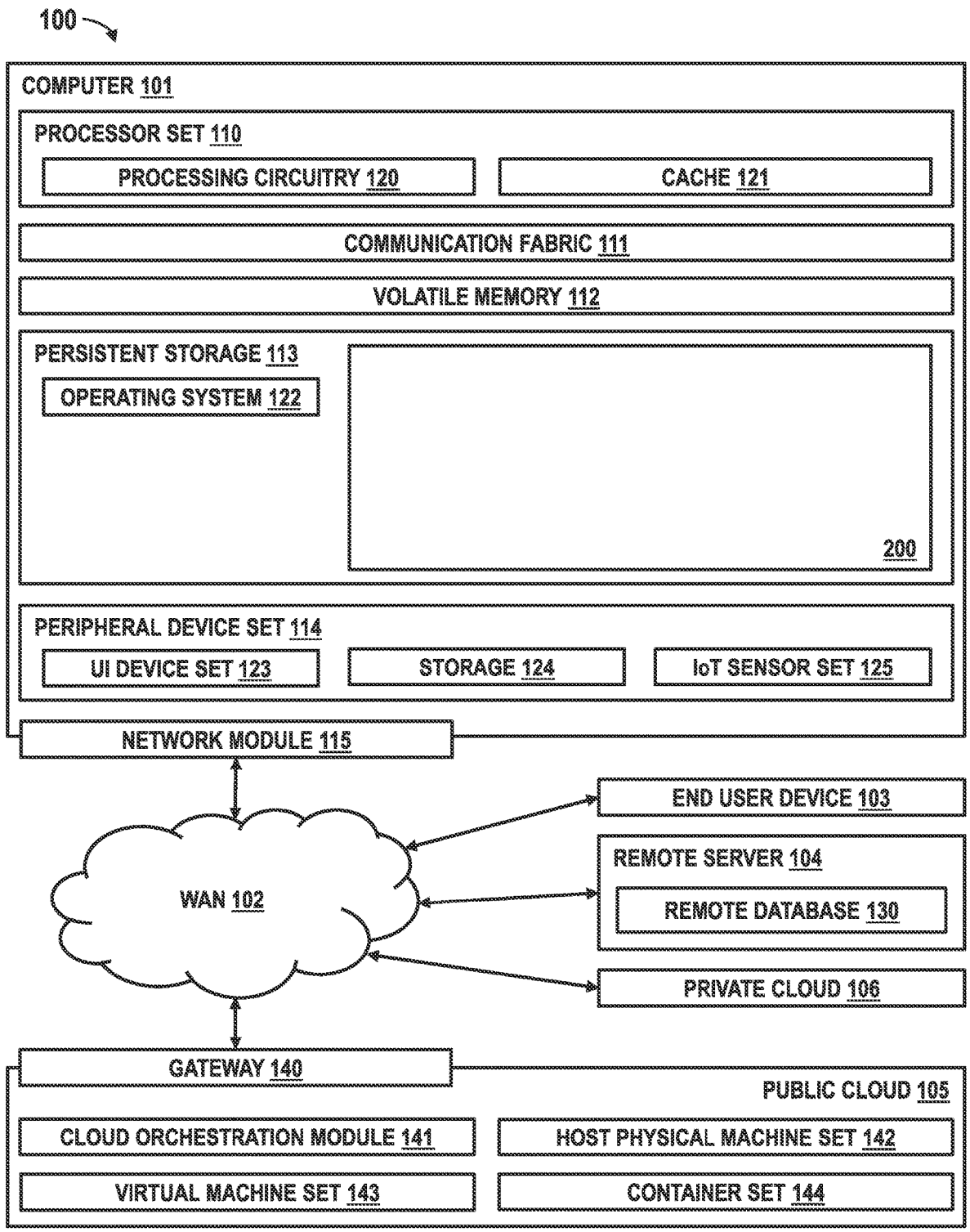
FIG. 6 depicts a computing environment according to an embodiment of the present invention.

One or more embodiments include appropriate peripheral circuitry 512, 516 and a suitable controller 520, for input/output, programming with weights, and so on. The peripheral circuitry 512, 516 can include pulse units for programming, an input vector peripheral circuit 512 to input the activation $z_1^x$ (which includes components $a_1$, $b_1$), an output buffer or the like to hold the results of the multiply-accumulate operation, and the like. Given the teachings herein, the skilled artisan will be able to provide any additional desired/required peripheral circuitry, voltage/power supply (can be controlled by controller to supply appropriate voltages as described, can be part of controller 520 or a separate unit), elements to interface with peripheral circuitry, and a controller by adapting known techniques, e.g., integrators based on an op-amp and capacitor, digital logic circuitry, field-programmable gate array (FPGA) or application specific integrated circuit (ASIC) or specific macro on a memory chip, and the like. One or more embodiments thus include an input vector peripheral circuit (e.g., 512) coupled to the plurality of activation inputs; and a control circuit 520 configured to control the input vector peripheral circuit 512 to carry out the multiply-accumulate operations with the plurality of memristive cells having the neural network weights stored therein. To implement any of the digital circuitry described herein, computer-aided semiconductor integrated circuit (IC) logic design, simulation, test, layout, and/or manufacture can be employed. The computerized design process can represent functional and/or structural design features in a design structure generated using electronic computer-aided design (ECAD). A suitable hardware-description language (HDL) can be employed. The skilled artisan can synthesize digital logic circuits to carry out desired control and other functionality, using known computer-aided design techniques implemented on a machine such as depicted in FIG. 6.

In one example embodiment, an analog memory-based complex weight unit cell comprises four source follower circuits with each source follower circuit having an analog memory device with one terminal connected to the source and the other terminal connected to a common node NA between all analog memory elements that is held at a voltage VA (for example, 0.4V), where the conductances in the first two source follower circuits differentially define the real portion of the complex weight and where the conductances in the second two source follower circuits differentially define the imaginary portion of the complex weight. The use of a source follower is appropriate in one or more embodiments as it is desirable for the source voltage to remain stable across a variety of different conductance values in order for the computation to work.

In one example embodiment, a pulse duration proportional to the real part of a complex valued input activation is applied to the gates of a first differential pair of source follower circuits representing the real portion of the complex weight.

In one example embodiment, a pulse duration proportional to the imaginary part of a complex valued input activation is applied to the gates of the second differential pair of source follower circuits representing the imaginary portion of the complex weight.

In one example embodiment, the drain voltage of the source follower circuits are configurable to a series of voltages above and/or below $V_A$.

In one example embodiment, two or more unit cells are tied together at a common node $N_A$.

In one example embodiment, the current at the common node $N_A$ is measured by accumulating charge on a capacitor and measuring the charge using an analog-to-digital-converter. In one example embodiment, a pulse duration proportional to the real part of the activation is applied to the source follower gates corresponding to the imaginary portion of the complex weight and a pulse duration proportional to the imaginary part of the activation is applied to the source follower gates corresponding to the real portion of the complex weight.

Given the discussion thus far, it will be appreciated that, in general terms, an exemplary circuit, according to an aspect of the invention, includes a first pulse-width modulator 108-1 configured to generate a first pulse based on a first input; a second pulse-width modulator 108-2 configured to generate a second pulse based on a second input; a first differential circuit 112-1 comprising a first transistor 140-1, a second transistor 140-2, a first resistor 136-1, and a second resistor 136-2; a second differential circuit 112-2 comprising a first transistor 140-3, a second transistor 140-4, a first resistor 136-3, and a second resistor 136-4, wherein: a gate of the first transistor 140-1 of the first differential circuit 112-1 and a gate of the second transistor 140-2 of the first differential circuit 112-1, and a gate of the first transistor 140-3 of the second differential circuit 112-2 and a gate of the second transistor 140-4 of the second differential circuit 112-2 are configured to be controlled by the first and second pulse width modulators based on the first input and the second input; wherein: the first resistor 136-1 of the first differential circuit 112-1 has a configurable resistance, a first terminal of the first resistor 136-1 is coupled to a voltage via a voltage supply node 132 and a second terminal of the first resistor 136-1 is coupled to a first terminal of the first transistor 140-1 of the first differential circuit 112-1; the second resistor 136-2 of the first differential circuit 112-1 has a configurable resistance, a first terminal of the second resistor 136-2 of the first differential circuit 112-1 is coupled to the voltage via the voltage supply node 132 and a second terminal of the second resistor 136-2 of the first differential circuit 112-1 is coupled to a first terminal of the second transistor 140-2 of the first differential circuit 112-1; the first resistor 136-3 of the second differential circuit 112-2 has a configurable resistance, a first terminal of the first resistor 136-3 of the second differential circuit 112-2 is coupled to the voltage via the voltage supply node 132 and a second terminal of the first resistor 136-3 of the second differential circuit 112-2 is coupled to a first terminal of the first transistor 140-3 of the second differential circuit 112-2; and the second resistor 136-4 of the second differential circuit 112-2 has a configurable resistance, a first terminal of the second resistor 136-4 of the second differential circuit 112-2 is coupled to the voltage via the voltage supply node 132 and a second terminal of the second resistor 136-4 of the second differential circuit 112-2 is coupled to a first terminal of the second transistor 140-4 of the second differential circuit 112-2; and the circuit further comprising an analog-to-digital converter 116 having an input coupled to the voltage supply node 132. As will be appreciated by the skilled artisan, the voltage supply node 132 is configured to be connected to a suitable voltage supply. During operation of the circuit, voltage from the voltage supply is applied to the voltage supply node 132. A constant voltage is typically applied to the voltage supply node 132. The constant voltage can be supplied from a constant voltage supply or from a variable voltage supply configured to supply a constant voltage.

In one example embodiment, the first resistor 136-1 and the second resistor 136-2 of the first differential circuit 112-1 are configured based on a first corresponding weight of a multiply-accumulate operation and the first resistor 136-3 and the second resistor 136-4 of the second differential circuit 112-2 are configured based on a second corresponding weight of the multiply-accumulate operation. In one example embodiment, the circuit further comprises a first input register 104-1 coupled to an input of the first pulse-width modulator 108-1 and configured to store the first input; a second input register 104-2 coupled to an input of the second pulse-width modulator 108-2 and configured to store the second input; and a controller circuit configured to control loading of the first input register 104-1 and the second input register 104-2.

In one example embodiment, the circuit further comprises a real component output register 120-2, an input of the real component output register 120-2 being coupled to an output of the analog-to-digital converter 116; an imaginary component output register 120-1, an input of the real component output register 120-1 being coupled to the output of the analog-to-digital converter 116; and a controller circuit configured to control loading of the real component output register 120-2 and the imaginary component output register 120-1.

In one example embodiment, a second terminal of the first transistor 140-1 of the first differential circuit 112-1, a second terminal of the second transistor 140-2 of the first differential circuit 112-1, a second terminal of the first transistor 140-3 of the second differential circuit 112-2, and a second terminal of the second transistor 140-4 of the second differential circuit 112-2 are configured to be selectively coupled between a voltage representing a sign of the first input and a voltage representing a sign of the second input and the circuit further comprising a controller circuit configured to control the selective coupling between the voltage representing the sign of the first input and the voltage representing the sign of the second input.

In one example embodiment, the analog-to-digital converter 116 comprises one or more current mirrors and one or more capacitive elements configured to accumulate charge from the voltage supply node 132.

In one example embodiment, the first terminal of the first transistor 140-1 of the first differential circuit 112-1, the first terminal of the second transistor 140-2 of the first differential circuit 112-1, the first terminal of the first transistor 140-3 of the second differential circuit 112-2, the first terminal of the second transistor 140-4 of the second differential circuit 112-2, a second terminal of the first transistor 140-1 of the first differential circuit 112-1, a second terminal of the second transistor 140-2 of the first differential circuit 112-1, a second terminal of the first transistor 140-3 of the second differential circuit 112-2, and a second terminal of the second transistor 140-4 of the second differential circuit 112-2 are each a corresponding one of a source terminal and a drain terminal; that is, each (field effect) transistor 140-1, 140-2, 140-3, 140-4 has a source terminal and a drain terminal.

In one aspect, a circuit 200 comprises a differential circuit 212-1 comprising a first transistor 140-1, a second transistor 140-2, a first resistor 136-1, and a second resistor 136-2; a first pulse-width modulator 108-1 configured to generate a pulse based on a first input, an output of the first pulse-width modulator 108-1 configured to be selectively coupled to one of a gate of the first transistor 140-1 of the differential circuit 212-1 and a gate of the second transistor 140-2 of the differential circuit 212-1; the first resistor 136-1 of the differential circuit 212-1 having a configurable resistance, a first terminal of the first resistor 136-1 coupled to a voltage via a voltage supply node 132 and a second terminal of the first resistor 136-1 coupled to a first terminal of the first transistor 140-1; a second pulse-width modulator 108-2 configured to generate a pulse based on a second input, an output of the second pulse-width modulator 108-2 configured to be selectively coupled to one of the gate of the first transistor 140-1 of the differential circuit 212-1 and the gate of the second transistor 140-2 of the differential circuit 212-1; the second resistor 136-2 of the differential circuit 212-1 having a configurable resistance, a second terminal of the second resistor 136-2 coupled to the voltage via the voltage supply node 132 and coupled to the second terminal of the first resistor 136-1, and a second terminal of the second resistor 136-2 coupled to a first terminal of the second transistor 140-2; and an analog-to-digital converter 116 having an input coupled to the voltage supply node 132.

In one example embodiment, the first resistor 136-1 of the first differential circuit 212-1 is configured based on a first corresponding weight of a multiply-accumulate operation and the second resistor 136-2 of the first differential circuit 212-1 is configured based on a second corresponding weight of the multiply-accumulate operation. In one example embodiment, the circuit further comprises a first input register 104-1 coupled to an input of the first pulse-width modulator 108-1 and configured to store the first input, a second input register 104-2 coupled to an input of the second pulse-width modulator 108-2 and configured to store the second input, and a controller circuit configured to control loading of the first input register 104-1 and the second input register 104-2.

In one example embodiment, the circuit further comprises a real component output register 120-2 having an input coupled to an output of the analog-to-digital converter 116, an imaginary component output register 120-1 having an input coupled to the output of the analog-to-digital converter 116, and a controller circuit configured to control loading of the real component output register 120-2 and the imaginary component output register 120-1. In one example embodiment, a second terminal of the first transistor 140-1 and a second terminal of the second transistor 140-2 are configured to be selectively coupled between a voltage input representing a sign bit of the first input and a voltage input representing a sign bit of the second input and the circuit further comprises a controller circuit configured to control the selective coupling between the voltage input representing the sign of the first input and the voltage input representing the sign of the second input. (See, FIGS. 3A-3B.)

In one example embodiment, the first terminal of the first transistor 140-1, the first terminal of the second transistor 140-2 of the first differential circuit 112-1, a second terminal of the first transistor 140-1, and a second terminal of the second transistor 140-2 are each a corresponding one of a source terminal and a drain terminal. In one example embodiment, the circuit further comprises a first shared transistor 140-3 and a second shared transistor 140-4, the first shared resistor 136-3 having a configurable resistance, a first terminal of the first shared resistor 136-3 being coupled to the voltage via the voltage supply node 132 and a second terminal of the first shared resistor 136-3 being coupled to a first terminal of the first shared transistor 140-3; the second shared resistor 136-4 having a configurable resistance, a first terminal of the second shared resistor 136-4 being coupled to the voltage via the voltage supply node 132 and a second terminal of the second shared resistor 136-4 being coupled to a first terminal of the second shared transistor 140-4; and a second analog-to-digital converter 128 having an input coupled to the voltage supply node 132; wherein: the output of the first pulse-width modulator 108-1 is configured to be selectively coupled to one of a gate of the first shared transistor 140-3 and a gate of the second shared transistor 140-4 and the output of the second pulse-width modulator 108-2 configured to be selectively coupled to one of the gate of the first shared transistor 140-3 and the gate of the second shared transistor 140-4. (See, FIGS. 4A-4B.)

In one example embodiment, the circuit further comprises a real component shared output register 124-2 having an input coupled to an output of the analog-to-digital converter 128 and an imaginary component shared output register 124-1 having an input coupled to the output of the analog-to-digital converter 128. In one example embodiment, a second terminal of the first shared transistor 140-3 and a second terminal of the second shared transistor 140-4 are configured to be selectively coupled between a voltage input representing a sign bit of the first input and a voltage input representing a sign bit of the second input. In one example embodiment, the first terminal of the first shared transistor 140-3, the first terminal of the second shared transistor 140-4, a second terminal of the first shared transistor 140-3, and a second terminal of the second shared transistor 140-4 are each a corresponding one of a source terminal and a drain terminal.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Refer now to FIG. 6. Computing environment 100 contains an example of an environment for the execution of at least some of the computer code 200 involved in performing the inventive methods, such as training the unitless weight distribution in software using forward propagation and back propagation for a neural network, as is familiar to the skilled artisan, and also rescaling same so that the appropriate conductance in microsiemens or $\mu S$ can be programmed into appropriate hardware units in accordance with aspects of the invention; code can also be used for control aspects or to synthesize digital circuitry to carry out control aspects in a known manner. Also, analog MAC-engine circuits disclosed herein could be used within a general-purpose machine as illustrated, as a hardware accelerator. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 6. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
 a first pulse-width modulator configured to generate a first pulse based on a first input;
 a second pulse-width modulator configured to generate a second pulse based on a second input;
 a first differential circuit comprising a first transistor, a second transistor, a first resistor, and a second resistor;
 a second differential circuit comprising a first transistor, a second transistor, a first resistor, and a second resistor, wherein:
  a gate of the first transistor of the first differential circuit and a gate of the second transistor of the first differential circuit; and
  a gate of the first transistor of the second differential circuit and a gate of the second transistor of the second differential circuit are configured to be controlled by the first and second pulse width modulators based on the first input and the second input;
 wherein:
  the first resistor of the first differential circuit has a configurable resistance, a first terminal of the first resistor is coupled to a voltage supply node and a second terminal of the first resistor is coupled to a first terminal of the first transistor of the first differential circuit;

the second resistor of the first differential circuit has a configurable resistance, a first terminal of the second resistor of the first differential circuit is coupled to the voltage via the voltage supply node and a second terminal of the second resistor of the first differential circuit is coupled to a first terminal of the second transistor of the first differential circuit;

the first resistor of the second differential circuit has a configurable resistance, a first terminal of the first resistor of the second differential circuit is coupled to the voltage via the voltage supply node and a second terminal of the first resistor of the second differential circuit is coupled to a first terminal of the first transistor of the second differential circuit; and the second resistor of the second differential circuit has a configurable resistance, a first terminal of the second resistor of the second differential circuit is coupled to the voltage via the voltage supply node and a second terminal of the second resistor of the second differential circuit is coupled to a first terminal of the second transistor of the second differential circuit;

further comprising an analog-to-digital converter having an input coupled to the voltage supply node.

2. The circuit of claim 1, wherein the first resistor and the second resistor of the first differential circuit are configured based on a first corresponding weight of a multiply-accumulate operation and the first resistor and the second resistor of the second differential circuit are configured based on a second corresponding weight of the multiply-accumulate operation.

3. The circuit of claim 1, further comprising:
a first input register coupled to an input of the first pulse-width modulator and configured to store the first input;
a second input register coupled to an input of the second pulse-width modulator and configured to store the second input; and
a controller circuit configured to control loading of the first input register and the second input register.

4. The circuit of claim 1, further comprising:
a real component output register, an input of the real component output register being coupled to an output of the analog-to-digital converter;
an imaginary component output register, an input of the imaginary component output register being coupled to the output of the analog-to-digital converter; and
a controller circuit configured to control loading of the real component output register and the imaginary component output register.

5. The circuit of claim 1, wherein a second terminal of the first transistor of the first differential circuit, a second terminal of the second transistor of the first differential circuit, a second terminal of the first transistor of the second differential circuit, and a second terminal of the second transistor of the second differential circuit are configured to be selectively coupled between a voltage representing a sign of the first input and a voltage representing a sign of the second input, further comprising a controller circuit configured to control the selective coupling between the voltage representing the sign of the first input and the voltage representing the sign of the second input.

6. The circuit of claim 1, wherein the analog-to-digital converter comprises one or more current mirrors and one or more capacitive elements configured to accumulate charge from the voltage supply node.

7. The circuit of claim 1, wherein the first terminal of the first transistor of the first differential circuit, the first terminal of the second transistor of the first differential circuit, the first terminal of the first transistor of the second differential circuit, the first terminal of the second transistor of the second differential circuit, a second terminal of the first transistor of the first differential circuit, a second terminal of the second transistor of the first differential circuit, a second terminal of the first transistor of the second differential circuit, and a second terminal of the second transistor of the second differential circuit are each a corresponding one of a source terminal and a drain terminal.

8. A circuit comprising:
a differential circuit comprising a first transistor, a second transistor, a first resistor, and a second resistor;
a first pulse-width modulator configured to generate a pulse based on a first input, an output of the first pulse-width modulator configured to be selectively coupled to one of a gate of the first transistor of the differential circuit and a gate of the second transistor of the differential circuit;
the first resistor of the differential circuit having a configurable resistance, a first terminal of the first resistor coupled to a voltage supply node and a second terminal of the first resistor coupled to a first terminal of the first transistor;
a second pulse-width modulator configured to generate a pulse based on a second input, an output of the second pulse-width modulator configured to be selectively coupled to one of the gate of the first transistor of the differential circuit and the gate of the second transistor of the differential circuit;
the second resistor of the differential circuit having a configurable resistance, a second terminal of the second resistor coupled to the voltage via the voltage supply node and coupled to the second terminal of the first resistor, and a second terminal of the second resistor coupled to a first terminal of the second transistor; and
an analog-to-digital converter having an input coupled to the voltage supply node.

9. The circuit of claim 8, wherein the first resistor of the first differential circuit is configured based on a first corresponding weight of a multiply-accumulate operation and the second resistor of the first differential circuit is configured based on a second corresponding weight of the multiply-accumulate operation.

10. The circuit of claim 8, further comprising:
a first input register coupled to an input of the first pulse-width modulator and configured to store the first input;
a second input register coupled to an input of the second pulse-width modulator and configured to store the second input; and
a controller circuit configured to control loading of the first input register and the second input register.

11. The circuit of claim 8, further comprising:
a real component output register having an input coupled to an output of the analog-to-digital converter;
an imaginary component output register having an input coupled to the output of the analog-to-digital converter; and
a controller circuit configured to control loading of the real component output register and the imaginary component output register.

12. The circuit of claim 8, wherein a second terminal of the first transistor and a second terminal of the second transistor are configured to be selectively coupled between a voltage input representing a sign bit of the first input and a voltage input representing a sign bit of the second input and further comprising a controller circuit configured to control the selective coupling between the voltage input representing the sign of the first input and the voltage input representing the sign of the second input.

13. The circuit of claim 8, wherein the first terminal of the first transistor, the first terminal of the second transistor of the first differential circuit, a second terminal of the first transistor, and a second terminal of the second transistor are each a corresponding one of a source terminal and a drain terminal.

14. The circuit of claim 8, further comprising:
 a first shared transistor;
 a second shared transistor;
 the first shared resistor having a configurable resistance, a first terminal of the first shared resistor being coupled to the voltage via the voltage supply node and a second terminal of the first shared resistor being coupled to a first terminal of the first shared transistor;
 the second shared resistor having a configurable resistance, a first terminal of the second shared resistor being coupled to the voltage supply node and a second terminal of the second shared resistor being coupled to a first terminal of the second shared transistor; and
 a second analog-to-digital converter having an input coupled to the voltage supply node;

wherein:
 the output of the first pulse-width modulator is configured to be selectively coupled to one of a gate of the first shared transistor and a gate of the second shared transistor; and
 the output of the second pulse-width modulator is configured to be selectively coupled to one of the gate of the first shared transistor and the gate of the second shared transistor.

15. The circuit of claim 14, further comprising:
 a real component shared output register having an input coupled to an output of the analog-to-digital converter; and
 an imaginary component shared output register having an input coupled to the output of the analog-to-digital converter.

16. The circuit of claim 14, wherein a second terminal of the first shared transistor and a second terminal of the second shared transistor are configured to be selectively coupled between a voltage input representing a sign bit of the first input and a voltage input representing a sign bit of the second input.

17. The circuit of claim 14, wherein the first terminal of the first shared transistor, the first terminal of the second shared transistor, a second terminal of the first shared transistor, and a second terminal of the second shared transistor are each a corresponding one of a source terminal and a drain terminal.

\* \* \* \* \*